United States Patent
Chen et al.

(10) Patent No.: US 10,985,116 B2
(45) Date of Patent: Apr. 20, 2021

(54) SEMICONDUCTOR PACKAGE AND METHOD OF FORMING THE SAME

(71) Applicant: Taiwan Semiconductor Manufacturing Co., Ltd., Hsinchu (TW)

(72) Inventors: Ching-Wen Chen, Kaohsiung County (TW); Hung-Jui Kuo, Hsinchu (TW); Ming-Che Ho, Tainan (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 16/352,838

(22) Filed: Mar. 14, 2019

(65) Prior Publication Data
US 2020/0294937 A1    Sep. 17, 2020

(51) Int. Cl.
*H01L 23/00* (2006.01)
*H01L 23/31* (2006.01)
*H01L 23/538* (2006.01)
*H01L 21/48* (2006.01)
*H01L 21/56* (2006.01)

(52) U.S. Cl.
CPC ........ *H01L 23/564* (2013.01); *H01L 21/4853* (2013.01); *H01L 21/4857* (2013.01); *H01L 21/565* (2013.01); *H01L 23/3128* (2013.01); *H01L 23/5383* (2013.01); *H01L 23/5386* (2013.01); *H01L 23/5389* (2013.01); *H01L 24/19* (2013.01); *H01L 24/20* (2013.01); *H01L 2224/214* (2013.01); *H01L 2924/364* (2013.01)

(58) Field of Classification Search
CPC .............. H01L 23/564; H01L 23/3128; H01L 23/5383; H01L 23/5386; H01L 23/5389; H01L 23/49816; H01L 21/4853; H01L 21/565; H01L 24/19; H01L 24/20
USPC .......... 257/668, 734, 737, 738, 773, E23.01, 257/E23.021, E23.023, E23.07, E21.331, 257/E21.476, E21.506, E21.575, E21.599; 438/109, 460, 612, 613, 614, 798
See application file for complete search history.

(56) References Cited

U.S. PATENT DOCUMENTS

| | | | |
|---|---|---|---|
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 2012/0211879 A1* | 8/2012 | Watanabe | H01L 27/14687 257/734 |
| 2013/0147032 A1* | 6/2013 | Jeng | H01L 21/76885 257/737 |
| 2014/0113445 A1* | 4/2014 | Chang | H01L 23/291 438/613 |
| 2020/0006263 A1* | 1/2020 | Seidemann | H05K 1/09 |

* cited by examiner

Primary Examiner — Dao H Nguyen
(74) Attorney, Agent, or Firm — JCIPRNET

(57) ABSTRACT

A semiconductor package and a method of forming the same are disclosed. A method of forming a semiconductor package includes the following operations. A polymer layer is formed over a die. A metal feature is formed in the polymer layer. An argon-containing plasma treatment is performed to the polymer layer and the metal feature.

20 Claims, 6 Drawing Sheets

10: 10a,10b,10c,10d,10e

10: 10a,10b,10c,10d,10e

US 10,985,116 B2

1

SEMICONDUCTOR PACKAGE AND METHOD OF FORMING THE SAME

BACKGROUND

In recent years, the semiconductor industry has experienced rapid growth due to continuous improvement in integration density of various electronic components, e.g., transistors, diodes, resistors, capacitors, etc. This improvement in integration density has come from successive reductions in minimum feature size, which allows more components to be integrated into a given area.

These smaller electronic components also require smaller packages that occupy less area than previous packages. Examples of types of semiconductor packages include quad flat packages (QFP), pin grid array (PGA) packages, ball grid array (BGA) packages, flip chips (FC), three-dimensional integrated circuits (3DICs), wafer level packages (WLPs), package on package (PoP) devices, etc. Although the existing semiconductor packages have been generally adequate for their intended purposes, they have not been entirely satisfactory in all respects.

DETAILED DESCRIPTION

Figure 1:
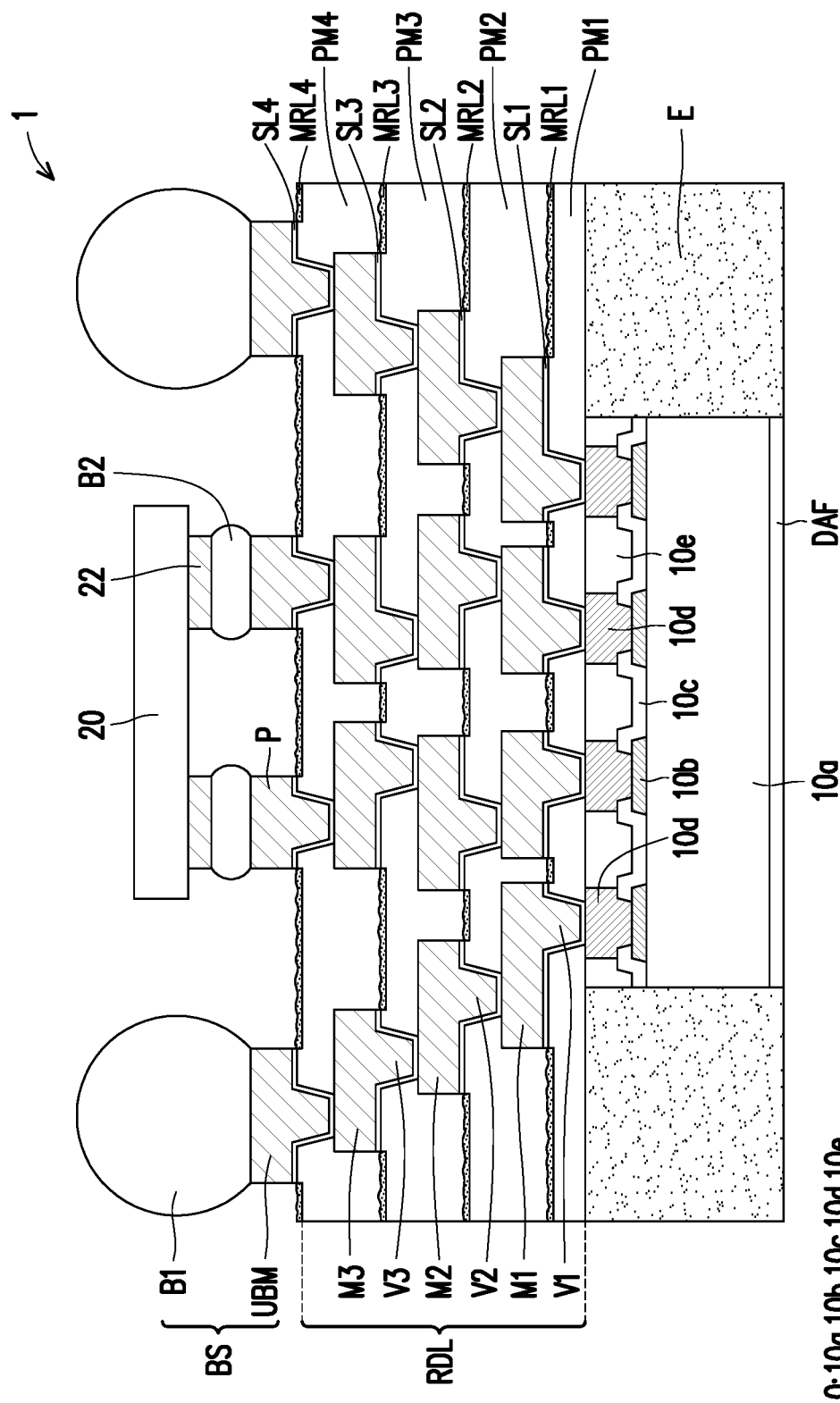
FIG. 1 is a cross-sectional view of a semiconductor package in accordance with some embodiments.

The following disclosure provides many different embodiments, or examples, for implementing different features of the provided subject matter. Specific examples of components and arrangements are described below for the purposes of conveying the present disclosure in a simplified manner. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the same reference numerals and/or letters may be used to refer to the same or similar parts in the various examples the present disclosure. The repeated use of the reference numerals is for the purpose of simplicity and clarity and does not in itself dictate a relationship between the various embodiments and/or configurations discussed.

Further, spatially relative terms, such as "beneath", "below", "lower", "on", "over", "above", "upper" and the like, may be used herein to facilitate the description of one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view of a semiconductor package in accordance with some embodiments. FIG. 2A to FIG. 2G are partial cross-sectional views of a method of forming a semiconductor package in accordance with some embodiments. In some embodiments, the semiconductor package of FIG. 1 is an integrated fan-out (InFO) package, but the disclosure is not limited thereto. The disclosure may be applied to an integrated fan-in package as needed.

Referring to FIG. 1, a semiconductor package 1 includes at least one first die 10. The first die 10 may be an application-specific integrated circuit (ASIC) chip, an analog chip, a sensor chip, a wireless and radio frequency chip, a voltage regulator chip or a memory chip, for example. In some embodiments, the first die 10 may include an active component or an integrated active device (IAD).

In some embodiments, the first die 10 includes a substrate 10a, at least one pad 10b over the substrate 10a, a passivation layer 10c over the substrate 10a and exposing a portion of the pad 10b, at least one connector 10d over the passivation layer 10c and electrically connected to the at least one pad 10b, and a protection layer 10e over the passivation layer 10c and aside the at least one connector 10d. The substrate 10a may include bulk silicon, doped or undoped, or an active layer of a semiconductor-on-insulator (SOI) substrate. The substrate 10a may have a device layer that includes a gate, source/drain regions, an interconnect structure, etc. The pad 10b may be electrically connected to the device layer and may include aluminum. Each of the passivation layer 10c and the protection layer 10e may include a dielectric material such as silicon oxide, silicon nitride or silicon oxynitride, a polymer material such as polybenzoxazole (PBO), polyimide (PI) or benzocyclobutene (BCB), or the like. The passivation layer 10c may include a material different from that of the protection layer 10e. In some embodiments, the side of the first die 10 with connectors 10d is referred to as a front side throughout the description. In some embodiments, a die attach film DAF is provided on the backside of the first die 10.

In some embodiments, an encapsulant E is further included in the semiconductor package 1. The encapsulant E is disposed aside the first die 10. The encapsulant E surrounds the first die 10, and exposes the surfaces of the connectors 10d. The encapsulant E includes a molding compound such as epoxy, a photo-sensitive material such as polybenzoxazole (PBO), polyimide (PI) or benzocyclobutene (BCB), a combination thereof or the like. In some embodiments, multiple through vias (not shown) such as through integrated fan-out vias (TIV) are formed through the encapsulant E for providing electrical connection between the die and other metal features.

In some embodiments, a polymer layer PM1, a metal line M1 and at least one via V1 are further included in the semiconductor package 1. In some embodiments, the polymer layer PM1 is disposed over the first die 10 and the encapsulant E. In some embodiments, the polymer layer PM1 includes polybenzoxazole (PBO), polyimide (PI), benzocyclobutene (BCB), a combination thereof or the like. In some embodiments, the at least one via V1 is disposed over and electrically connected to the corresponding connector 10d of the first die 10 and embedded by the polymer layer PM1, and the metal line M1 is disposed over the polymer layer PM1 and electrically connected to the at least one via V1.

In some embodiments, a seed layer SL1 is disposed between the metal line M1 and the polymer layer PM1, between the at least one via V1 and the polymer layer PM1 and between the at least one via V1 and the corresponding connector 10d. Through the specification, the seed layer not only serves as a seed for the subsequently formed metal feature, but also provides adhesion between adjacent metal features. Specifically, the seed layer SL1 not only serves as a seed for the subsequently formed vias V1 and metal line M1, but also provides adhesion between the vias V1 and the underlying connectors 10d. In some embodiments, each of the seed layer SL1, the metal line M1 and the at least one via V1 includes Ti, Ta, Cu, W, Ru, Co, Ni or an alloy thereof. In some embodiments, the seed layer SL1 may include Ti/Cu, and the metal line M1 and the at least one via V1 may include Cu. In some embodiments, the metal line M1, the at least one via V1 and the seed layer SL1 constitute a first redistribution layer.

In some embodiments, a polymer layer PM2, a metal line M2 and at least one via V2 are further included in the semiconductor package 1. In some embodiments, the polymer layer PM2 is disposed over the polymer layer PM1 and surrounding the metal line M1 and the at least one via V2. In some embodiments, the polymer layer PM2 includes polybenzoxazole (PBO), polyimide (PI), benzocyclobutene (BCB), a combination thereof or the like. In some embodiments, the at least one via V2 is disposed over and electrically connected to the metal line M1 and embedded by the polymer layer PM2, and the metal line M2 is disposed over the polymer layer PM2 and electrically connected to the at least one via V2.

In some embodiments, a seed layer SL2 is disposed between the metal line M2 and the polymer layer PM2, between the at least one via V2 and the polymer layer PM2 and between the at least one via V2 and the metal line M1. In some embodiments, each of the seed layer SL2, the metal line M2 and the at least one via V2 includes Ti, Ta, Cu, W, Ru, Co, Ni or an alloy thereof. In some embodiments, the seed layer SL2 may include Ti/Cu, and the metal line M2 and the at least one via V2 may include Cu. In some embodiments, the metal line M2, the at least one via V2 and the seed layer SL2 constitute a second redistribution layer.

In some embodiments, a moisture-resistant layer MRL1 is further included in the semiconductor package 1. Through the specification, the moisture-resistant layer is configured to prevent water or moisture from entering the package and therefore avoid oxidization of copper and delamination between copper and its surrounding polymer. In some embodiments, the moisture-resistant layer MRL1 is located aside the metal line M1 and between the polymer layers PM1 and PM2. Specifically, the moisture-resistant layer MRL1 is in physical contact with the metal line M1 and the polymer layers PM1 and PM2. In some embodiments, the polymer layer PM1 located below the metal line M1 is at a level higher than that of the polymer layer PM1 located below the moisture-resistant layer MRL1. In some embodiments, the polymer layer PM1 located below the moisture-resistant layer MRL1 has a substantially planar surface, as shown in FIG. 1. However, the disclosure is not limited thereto. In alternative embodiments, the polymer layer PM1 located below the moisture-resistant layer MRL1 has a smoothly recessed surface.

The moisture-resistant layer MRL1 has a composition different from that of the polymer layer PM1. Based on the total atoms of respective layers, the carbon atom content of the moisture-resistant layer MRL1 is less than that of the polymer layer PM1, and the argon atom content of the moisture-resistant layer MRL1 is more than that of the polymer layer PM1. In some embodiments, the moisture-resistant layer MRL1 includes a carbon atom content of about 75 at % or more and an argon atom content of about 0.2-2 at %. For example, the carbon atom content of the moisture-resistant layer MRL1 may be, for example but not limited to, about 75 at %, 80 at %, 85 at % or 90 at %, including any range between any two of the preceding values. Similarly, the argon atom content of the moisture-resistant layer MRL1 may be, for example but not limited to, about 0.2 at %, 0.5 at %, 1 at %, 1.5 at % or 2 at %, including any range between any two of the preceding values. In some embodiments, the moisture-resistant layer MRL1 further includes a nitrogen atom content of less than about 4 at % and an oxygen atom content of less than 12 at %. In some embodiments, the polymer layer PM1 includes a carbon atom content of about 70 at % or less and an argon atom content of less than about 0.1 at %.

In some embodiments, the moisture-resistant layer MRL1 has a contact angle of about 70° to 120°. As used herein, the term "contact angle" is used to describe an angle that a liquid (e.g., water) creates with a solid surface at an interface between the liquid and the solid surface. In some embodiments, the moisture-resistant layer is referred to as a "hydrophobic layer" when the contact angle thereof is between about 90° and 120°. In some embodiments, the moisture-resistant layer MRL1 has a contact angle of, for example but not limited to, about b 70°, 75°, 80°, 85°, 90°, 95°, 100°, 105°, 110°, 115° or 120°, including any range between any two of the preceding values and any range more than any one of the preceding values. The moisture-resistant layer has such contact angle to effectively block water or moisture from penetrating into the package.

In some embodiments, the moisture-resistant layer MRL1 has a thickness of about 20 angstroms or more, such as 50 angstroms, 100 angstroms, 150 angstroms, 200 angstroms, 250 angstroms, 300 angstroms, 350 angstroms, 400 angstroms, 450 angstroms, 500 angstroms, 1000 angstroms, 1500 angstroms or 2000 angstroms, including any range between any two of the preceding values and any range more than any one of the preceding values. The moisture-resistant layer has such thickness to effectively block water or moisture from penetrating into the package.

In some embodiments, the moisture-resistant layer MRL1 has a rough top surface. The rough surface may be wavy, wrinkled and/or non-smooth from a top view. In some embodiments, the moisture-resistant layer MRL1 has a surface roughness Rz of about 0.1 μm or more, such as 0.2 μm, 0.3 μm, 0.4 μm, 0.5 μm, 0.6 μm, 0.7 μm, 0.8 μm, 0.9 μm or 1 μm, including any range between any two of the preceding values and any range more than any one of the preceding values. The moisture-resistant layer with a rough top surface functions as a protection layer that effectively blocks water or moisture from penetrating into the package.

In some embodiments, a polymer layer PM3, a metal line M3 and at least one via V3 are further included in the semiconductor package 1. In some embodiments, the polymer layer PM3 is disposed over the polymer layer PM2 and surrounding the metal line M2 and the at least one via V3. In some embodiments, the polymer layer PM3 includes polybenzoxazole (PBO), polyimide (PI), benzocyclobutene (BCB), a combination thereof or the like. In some embodiments, the at least one via V3 is disposed over and electrically connected to metal line M2 and embedded by the polymer layer PM3, and the metal line M3 is disposed over the polymer layer PM3 and electrically connected to the at least one via V3.

In some embodiments, a seed layer SL3 is disposed between the metal line M3 and the polymer layer PM3, between the at least one via V3 and the polymer layer PM3 and between the at least one via V3 and the metal line M2. In some embodiments, each of the seed layer SL3, the metal line M3 and the at least one via V3 includes Ti, Ta, Cu, W, Ru, Co, Ni or an alloy thereof. In some embodiments, the seed layer SL3 may include Ti/Cu, and the metal line M3 and the at least one via V3 may include Cu. In some embodiments, the metal line M3, the at least one via V3 and the seed layer SL3 constitute a third redistribution layer.

In some embodiments, a moisture-resistant layer MRL2 is further included in the semiconductor package 1. In some embodiments, the moisture-resistant layer MRL2 is located aside the metal line M2 and between the polymer layers PM2 and PM3. Specifically, the moisture-resistant layer MRL2 is in physical contact with the metal line M2 and the polymer layers PM2 and PM3. In some embodiments, the polymer layer PM2 located below the metal line M2 is at a level higher than that of the polymer layer PM2 located below the moisture-resistant layer MRL2. In some embodiments, the polymer layer PM2 located below the moisture-resistant layer MRL2 has a substantially planar surface or a smoothly recessed surface.

In some embodiments, the moisture-resistant layer MRL2 has a carbon atom content of about 75 at % or more and an argon atom content of about 0.2-2 at %. In some embodiments, the moisture-resistant layer MRL2 has a contact angle of about 70° to 120°. In some embodiments, the moisture-resistant layer MRL2 has a thickness of about 20 angstroms or more. In some embodiments, the moisture-resistant layer MRL2 has a rough top surface. For example, the moisture-resistant layer MRL2 has a surface roughness Rz of about 0.1 μm or more. The moisture-resistant layer MRL2 is similar to the moisture-resistant layer MRL1, the descriptions and possible ranges of the composition, contact angle, surface roughness and thickness of the moisture-resistant layer MRL2 can refer to those of the moisture-resistant layer MRL1, and details are not iterated herein.

In some embodiments, a polymer layer PM4 is further included in the semiconductor package 1. In some embodiments, the polymer layer PM4 is disposed over the polymer layer PM3 aside the metal line M3 and exposes a part of the metal line M3. In some embodiments, the polymer layer PM4 includes polybenzoxazole (PBO), polyimide (PI), benzocyclobutene (BCB), a combination thereof or the like.

In some embodiments, under bump metallization pads UBM are further included in the semiconductor package 1. The under bump metallization pads UBM are disposed over and electrically connected to the metal line M3. In some embodiments, connection pads P are formed during the operation of forming the under bump metallization pads UBM. The connection pads P are disposed over and electrically connected to the metal line M3. In some embodiments, the under bump metallization pads UBM surround the connection pads P.

In some embodiments, a seed layer SL4 is disposed between each under bump metallization pad UBM and the polymer layer PM4 and between the under bump metallization pad UBM and the metal line M3. Similarly, a seed layer SL4 is disposed between each connection pad P and the polymer layer PM4 and between the connection pad P and the metal line M3. In some embodiments, each of the seed layer SL4, the under bump metallization pads UBM and the connection pads P includes Ti, Ta, Cu, W, Ru, Co, Ni or an alloy thereof. In some embodiments, the seed layer SL4 may include Ti/Cu, and the under bump metallization pads UBM and the connection pads P may include Cu.

In some embodiments, a moisture-resistant layer MRL3 is further included in the semiconductor package 1. In some embodiments, the moisture-resistant layer MRL3 is located aside the metal line M3 and between the polymer layers PM3 and PM4. Specifically, the moisture-resistant layer MRL3 is in physical contact with the metal line M3 and the polymer layers PM3 and PM4. In some embodiments, the polymer layer PM3 located below the metal line M3 is at a level higher than that of the polymer layer PM3 located below the moisture-resistant layer MRL3. In some embodiments, the polymer layer PM3 located below the moisture-resistant layer MRL3 has a substantially planar surface or a smoothly recessed surface.

In some embodiments, the moisture-resistant layer MRL3 has a carbon atom content of about 75 at % or more and an argon atom content of about 0.2-2 at %. In some embodiments, the moisture-resistant layer MRL3 has a contact angle of about 70° to 120°. In some embodiments, the moisture-resistant layer MRL3 has a thickness of about 20 angstroms or more. In some embodiments, the moisture-resistant layer MRL3 has a rough top surface. For example, the moisture-resistant layer MRL3 has a surface roughness Rz of about 0.1 μm or more. The moisture-resistant layer MRL3 is similar to the moisture-resistant layer MRL1, the descriptions and possible ranges of the composition, contact angle, surface roughness and thickness of the moisture-resistant layer MRL3 can refer to those of the moisture-resistant layer MRL1, and details are not iterated herein.

A redistribution layer structure RDL of the disclosure is thus completed. The redistribution layer structure RDL is referred to as a front-side redistribution layer structure in some examples. In some embodiments, the redistribution layer structure RDL includes the vias V1, V2 and V3, the metal lines M1, M2 and M3, and the seed layer SL1, SL2 and SL3. In some embodiments, the redistribution layer structure RDL further includes polymer layers PM1, PM2, PM3 and PM4 and the moisture-resistant layers MRL1, MRL2 and MRL3 alternately stacked. In some embodiments, the redistribution layer structure RDL optionally includes the bump metallization pads UBM and the seed layer SL4.

In some embodiments, a moisture-resistant layer MRL4 is further included in the semiconductor package 1. In some embodiments, the moisture-resistant layer MRL4 is located aside the under bump metallization pads UBM and the connection pads P and on the surface of the polymer layer PM4. In some embodiments, the polymer layer PM4 located below the under bump metallization pads UBM or the connection pads P is at a level higher than that of the polymer layer PM4 located below the moisture-resistant layer MRL4. In some embodiments, the polymer layer PM4 located below the moisture-resistant layer MRL4 has a substantially planar surface or a smoothly recessed surface.

In some embodiments, the moisture-resistant layer MRL4 has a carbon atom content of about 75 at % or more and an argon atom content of about 0.2-2 at %. In some embodiments, the moisture-resistant layer MRL4 has a contact angle of about 70° to 120°. In some embodiments, the moisture-resistant layer MRL4 has a thickness of about 20 angstroms or more. In some embodiments, the moisture-resistant layer MRL4 has a rough top surface. For example, the moisture-resistant layer MRL4 has a surface roughness Rz of about 0.1 μm or more. The moisture-resistant layer MRL4 is similar to the moisture-resistant layer MRL1, the descriptions and possible ranges of the composition, contact angle, surface roughness and thickness of the moisture-resistant layer MRL4 can refer to those of the moisture-resistant layer MRL1, and details are not iterated herein.

In some embodiments, bumps B1 are further included in the semiconductor package 1. The bumps B1 are disposed over and electrically connected to the under bump metallization pads UBM. In some embodiments, the bumps B1 include copper, solder, nickel or a combination thereof. In some embodiments, each of the under bump metallization pads UBM and the overlying bump B1 constitute a bump structure BS.

In some embodiments, at least one second die 20 is further included in the semiconductor package 1. The second die 20 is bonded to the connection pads P through micro-bumps B2. In some embodiments, a second die 20 having pads 22 and overlying micro-bumps B2 is bonded to the connection pads P with the front side thereof facing the front-side redistribution layer structure RDL. In some embodiments, the second die 20 is an integrated passive device (IPD) including resistors, capacitors, inductors, resonators, filters, and/or the like. In alternative embodiments, the second die 20 may be an integrated active device (IAD) upon the process requirements. In some embodiments, the dimension of the bumps B1 is greater than (e.g., at least 3 times) the dimension of the micro-bumps B2.

In view of the above, the semiconductor package 1 includes at least one first die 10, a redistribution layer structure RDL, a bump structure BS and a moisture-resistant layer MRL4. The redistribution layer structure RDL is disposed over and electrically to the at least one first die 10. The bump structure BS is disposed over and electrically connected to the redistribution layer structure RDL. The moisture-resistant layer MRL4 is disposed over the redistribution layer structure RDL aside the bump structure BS and has a rough top surface. Specifically, the moisture-resistant layer MRL4 is in physical contact with the bump structure BS and a polymer layer PM4 of the redistribution layer structure RDL. In some embodiments, the semiconductor package 1 further includes at least one second die 20 that is electrically connected to the first die 10.

In some embodiments, in order to further improve the capability of preventing outside moisture from penetrating into the package, the redistribution layer structure RDL further includes at least one moisture-resistant layer between polymer layers. Specifically, the redistribution layer structure RDL includes polymer layers PM1, PM2, PM3 and PM4 and the moisture-resistant layers MRL1, MRL2 and MRL3 alternately stacked. In some embodiments, only upper moisture-resistant layers are provided in the semiconductor package while the lower moisture-resistant layers are omitted from the semiconductor package. For example, the moisture-resistant layers MRL3 and MRL4 are provided in the semiconductor package 1 while the moisture-resistant layers MRL1 and MRL2 may be omitted from the semiconductor package 1.

The method of forming the semiconductor package in FIG. 1 is locally illustrated in FIGS. 2A to 2G in the following.

Figure 2A:
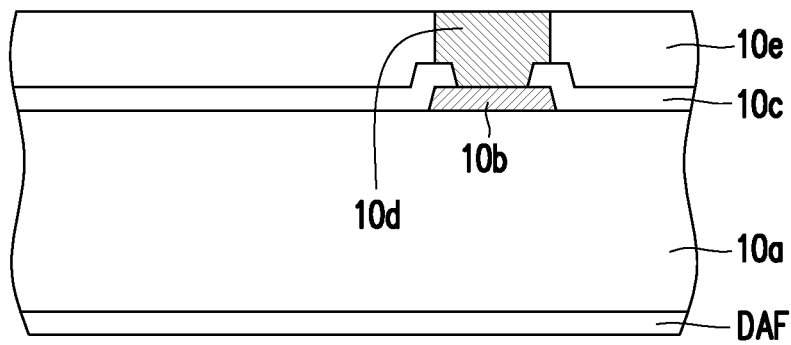
FIG. 2A to FIG. 2G are partial cross-sectional views of a method of forming a semiconductor package in accordance with some embodiments.

Referring to FIG. 2A, at least one first die 10 is placed on a carrier (not shown). The first die 10 has a substrate 10a, at least one pad 10b over the substrate 10a, a passivation layer 10c over the substrate 10a, at least one connector 10d over the passivation layer 10c and electrically connected to the pad 10b, and a protection layer 10e over the passivation layer 10c and aside the connector 10d. In some embodiment, a die attach film DAF is provided on the backside of the first die 10 and attached to the carrier.

Figure 2B:
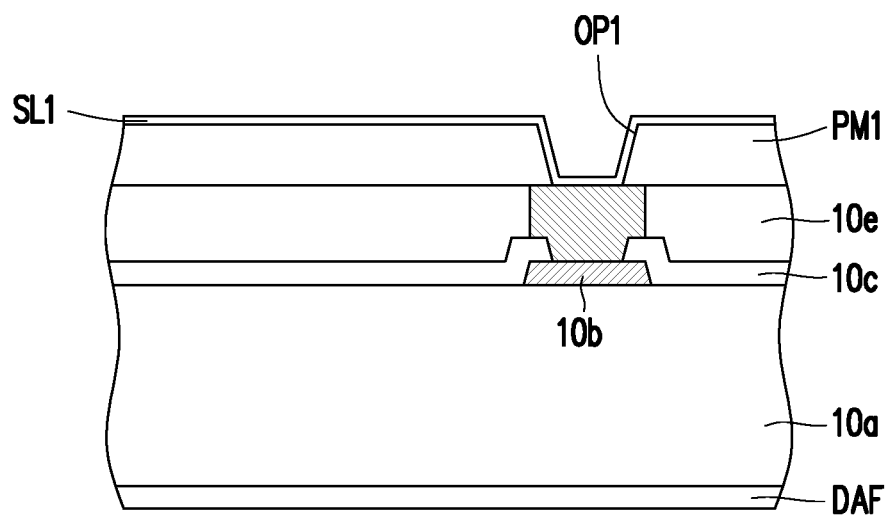

Referring to FIG. 2B, a polymer layer PM1 is formed over the connector 10d and the protection layer 10e. In some embodiments, the polymer layer PM1 includes polybenzoxazole (PBO), polyimide (PI), benzocyclobutene (BCB), a combination thereof or the like. In some embodiments, the polymer layer PM1 has at least one opening OP1 that exposes the intended location for the subsequently formed via V1. The opening for the at least one via V1 exposes the corresponding connector 10d of the first die 10.

Thereafter, a seed layer SL1 is formed over the polymer layer PM1 along the surface of the opening OP1. In some embodiments, the seed layer SL1 includes Ti/Cu, and is formed by a sputtering or a suitable method.

Figure 2C:
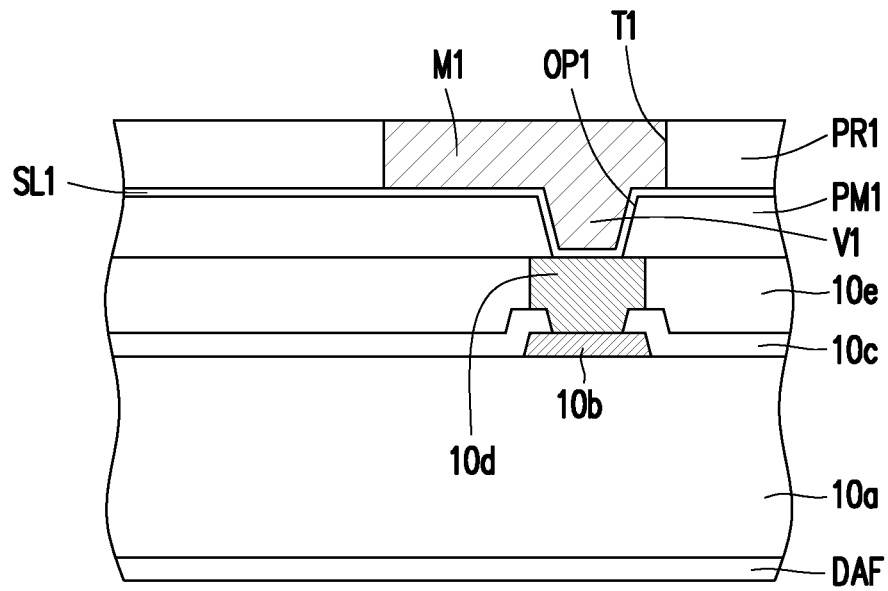

Referring to FIG. 2C, a photoresist layer PR1 is formed on the seed layer SL1. In some embodiments, the photoresist layer PR1 is a dry film resist (DFR) over the first die 10 and has at least one trench T1 that exposes the intended location for the subsequently formed metal line M1. The trench T for the subsequently formed metal line M1 is connected to the opening OP1 for the subsequently formed via V1.

Afterwards, a via V1 is formed in the opening OP1 of the polymer layer PM1 and a metal line M1 is formed in the trench T1 of the photoresist layer PR1. In some embodiments, the method of forming the via V1 and the metal line M1 includes performing an electroplating process. In some embodiments, the via V1 and the metal line M1 are plated in the opening OP1 and the trench T1 by using the seed layer SL1 as a seed. In some embodiments, the via V1 and the metal line M1 may include Cu. In some embodiments, the via V1 and the metal line M1 completely fill the opening OP1 and the trench T, as shown in FIG. 1G. However, the present disclosure is not limited thereto. In alternative embodiments, the via V1 and the metal line M1 are formed conformally on the surfaces of the opening OP1 and the trench T without filling up the opening OP1 and the trench T.

Figure 2D:
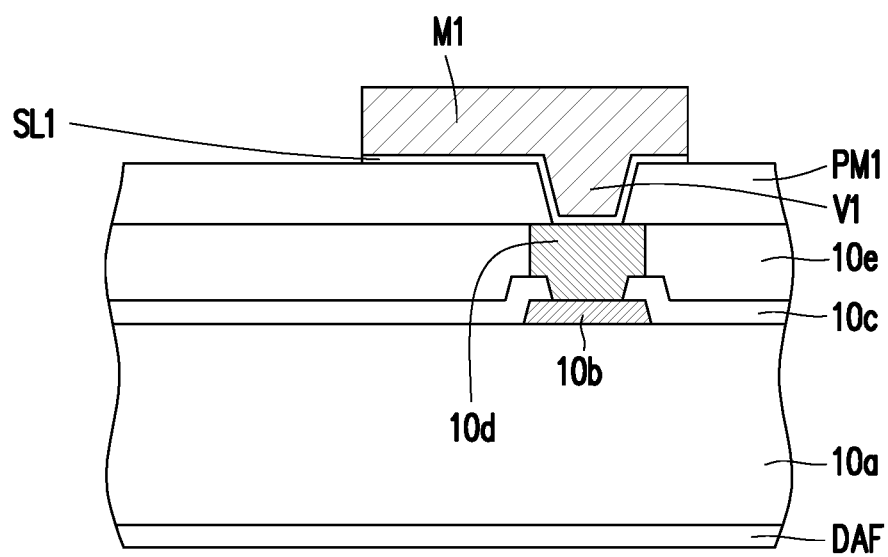

Referring to FIG. 2D, the photoresist layer PR1 and the underlying seed layer SL1 are removed. In some embodiments, the photoresist layer PR1 is removed, and then the seed layer SL1 is partially removed by using the metal line M1 as a mask. Therefore, the remaining seed layer SL1 is between the metal line M1 and the polymer layer PM1, between the via V1 and the polymer layer PM1 and between the via V1 and the corresponding connector 10d.

Figure 2E:
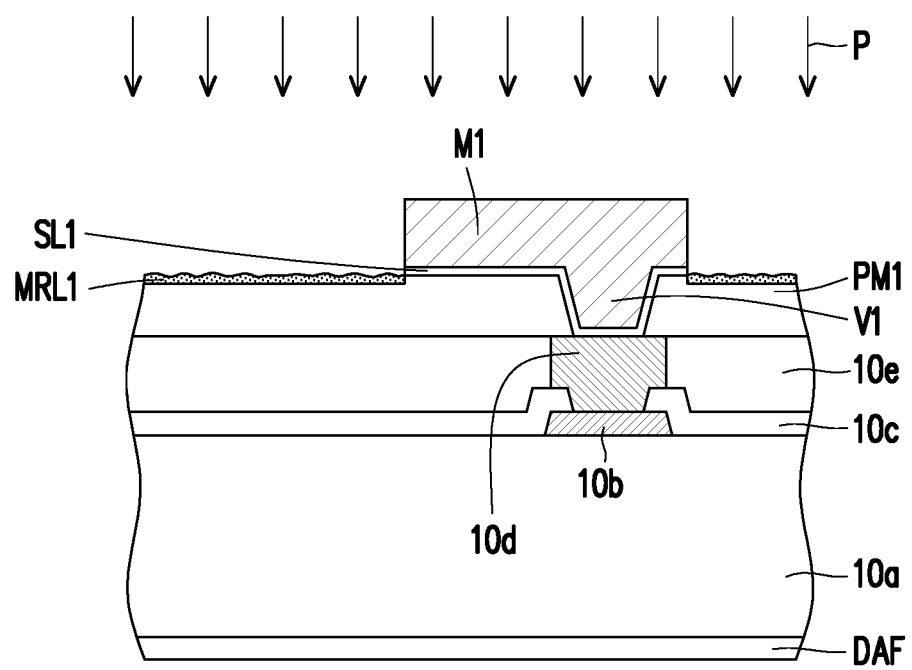

Referring to FIG. 2E, a plasma treatment P is performed to the polymer layer PM1 and the metal line M1, so as to form a moisture-resistant layer MRL1 on the polymer layer PM1. The plasma treatment is blanket performed in all areas without a shielding mask, so it is called a "self-aligned process" in some examples. In some embodiments, the gas of the plasma treatment P includes argon. The plasma treatment is referred to as an argon-containing plasma treatment in some examples. In some embodiments, the gas of the plasma treatment P further includes He, Ne, Kr, Xe, $O_2$, $H_2$, $N_2$ or a combination thereof. For example, the gas of the plasma treatment P includes Ar, a combination of Ar and He, a combination of Ar and Ne, a combination of Ar and Kr, a combination or Ar and Xe, a combination or Ar and $O_2$, a combination or Ar and $H_2$, a combination or Ar an $N_2$ or the like.

In some embodiments, the plasma treatment P includes an argon content of about 30 vol % or more. In some embodiments, the plasma treatment P includes an argon content of, for example but not limited to, about 30 vol %, 40 vol %, 50 vol %, 60 vol %, 70 vol %, 80 vol %, 90 vol % or 100 vol %, including any range between any two of the preceding values. In some embodiments, the plasma treatment P has such argon content to effectively change the surface property of the polymer layer to be more moisture-resistant.

In some embodiments, upon the argon-containing plasma treatment P, the treated portion of the polymer layer PM1 is more moisture-resistant than the untreated portion of the polymer layer PM1. Specifically, the plasma treatment P changes the property of treated portion of the polymer layer PM1, so the treated portion of the polymer layer PM1 becomes more resistant to the moisture and therefore forms a moisture-resistant layer MRL1 on the remaining portion of the polymer layer PM1.

In some embodiments, the untreated polymer layer PM1 has a contact angle of 7° to 10°, and the treated portion of the polymer layer PM1 (i.e., the moisture-resistant layer MRL1) has a contact angle of 70° to 120°. In some embodiments, the treated portion of the polymer layer PM1 (i.e., the moisture-resistant layer MRL1) has a thickness of 20 angstroms or more.

In view of the operations of FIG. 2A to FIG. 2E, a polymer layer PM1 is formed over a first die 10. A first redistribution layer including the metal line M1 and the via V1 is formed in the polymer layer PM1. A plasma treatment P is performed to make the polymer layer PM1 more moisture-resistant. Specifically, the surface portion of the polymer layer PM1 is transformed into a moisture-resistant layer MRL1.

Figure 2F:
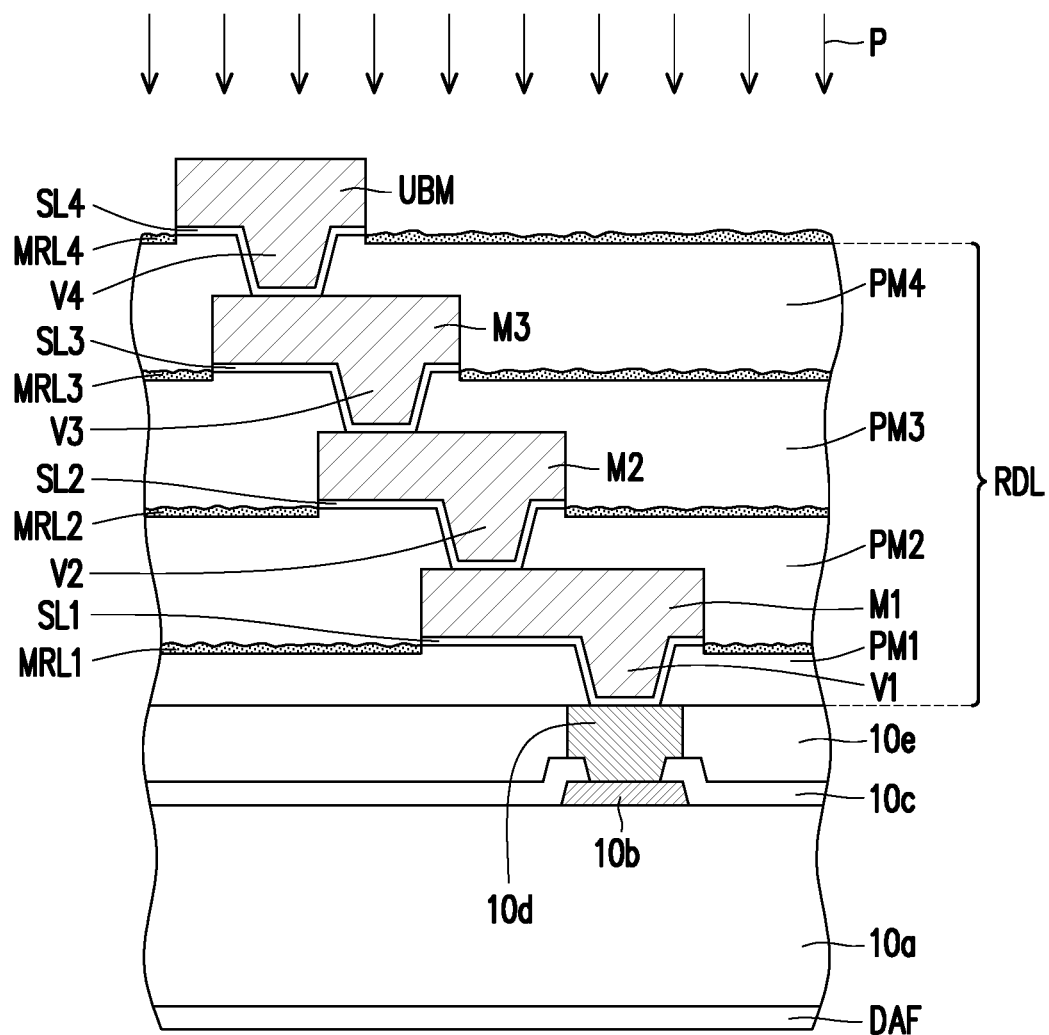

Referring to FIG. 2F, the operations similar to those in FIG. 2B to FIG. 2E are performed multiple times, so as to form a via V2 electrically connected to the metal line M1, a metal line M2 electrically connected to the via V2, a via V3 electrically connected to the metal line M2, a metal line M3 electrically connected to the via V3, and a via V4 electrically connected to the metal line M3. A redistribution layer structure RDL of this embodiment is thus completed.

The method of forming the redistribution layer structure RDL includes the following operations. A polymer layer PM2 is formed on the first redistribution layer. A second redistribution layer including the metal line M2 and the via V2 is formed in the polymer layer PM2. A plasma treatment P is performed to make the polymer layer PM2 more moisture-resistant. Specifically, the surface portion of the polymer layer PM2 is transformed into a moisture-resistant layer MRL2. A polymer layer PM3 is formed on the second redistribution layer. A third redistribution layer including the metal line M3 and the at least one via V3 is formed in the polymer layer PM3. A plasma treatment P is performed to make the polymer layer PM3 more moisture-resistant. Specifically, the surface portion of the polymer layer PM3 is transformed into a moisture-resistant layer MRL3. A polymer layer PM4 is formed on the third redistribution layer.

Figure 2G:
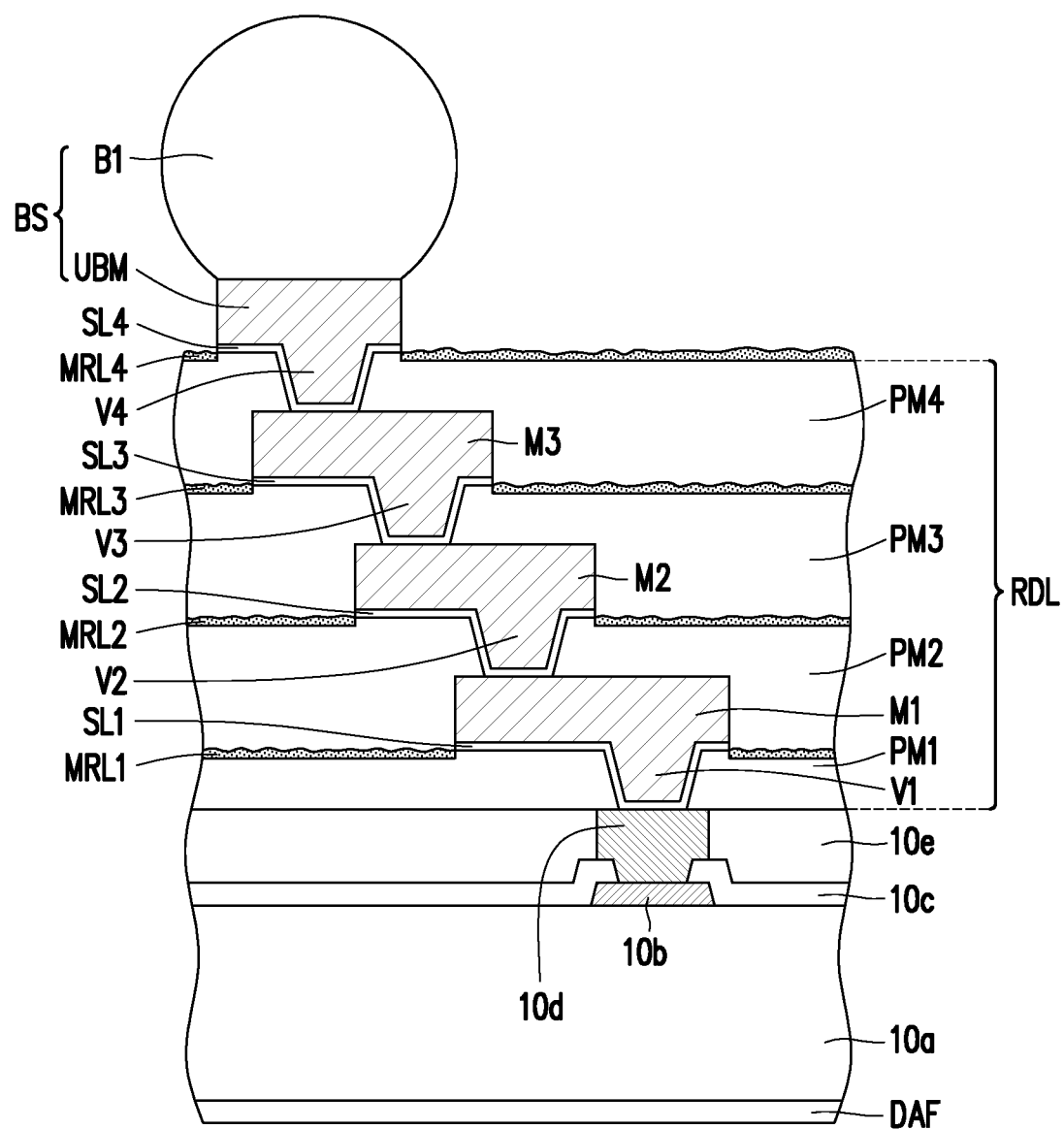

In some embodiments, after the redistribution layer structure RDL is formed over the first die 10, a bump structure BS is formed over the redistribution layer structure RDL, as shown in FIG. 2F and FIG. 2G. A plasma treatment P is performed to make the uppermost polymer layer PM4 of the redistribution layer structure RDL more moisture-resistant. In some embodiments, the plasma treatment P is performed after the formation of the under bump metallization pad UBM and before the formation of the bump B1, as shown in FIG. 2F and FIG. 2G. However, the present disclosure is not limited thereto. In alternative embodiments, the plasma treatment P may be performed after the formation of the under bump metallization pad P and the bump B1.

In some embodiments, a method of forming a semiconductor package includes the following operations. A polymer layer is formed over a first die 10. The polymer layer may be a polymer layer PM1, a polymer layer PM2, a polymer layer PM3 or a polymer layer PM4. Thereafter, metal feature is formed in the polymer layer. The metal feature may be a first redistribution layer, a second redistribution layer, a third redistribution layer or a bump metallization pad. Afterwards, an argon-containing plasma treatment P is performed to the polymer layer and the metal feature, so as to form a moisture-resistant layer on the top of the polymer layer. The moisture-resistant layer may be a first moisture-resistant layer MRL1, a second moisture-resistant layer MRL2, a third moisture-resistant layer MRL3 or a fourth moisture-resistant layer MRL4.

The above embodiments in which the metal feature is a part of a redistribution layer structure or a bump structure of semiconductor package are provided for illustration purposes, and are not construed as limiting the present disclosure. In alternative embodiments, the metal feature may be a part of an interconnect structure of a die. Specifically, the argon-containing plasma treatment of the disclosure may be applied to the interconnect structure, so as to make the interconnect structure and therefore the die more moisture-resistant.

In some embodiments, a method of forming a semiconductor package includes the following operations. At least one first die 10 is provided, as show in FIG. 2A. A redistribution layer structure RDL is formed over the at least one first die 10, as shown in FIG. 2B to FIG. 2F. A bump structure BS is formed over the redistribution layer structure RDL, as shown in FIG. 2F to FIG. 2G. A plasma treatment P is performed to make the uppermost polymer layer PM4 of the redistribution layer structure RDL more moisture-resistant, as shown in FIG. 2F.

When the redistribution layer is defined by the conventional process, the polymer layers are easy to absorb the outside moisture, inducing oxidation of copper after the thermal process and causing failure in the reliability test. Porous Cu oxidation film is easy to crack and cause delamination between copper and its surrounding polymer. However, such issue is not observed in the disclosure.

In some embodiments of the disclosure, a polymer layer is modified by a self-aligned plasma treatment, so the surface portion thereof becomes more moisture-resistant or more hydrophobic. The surface portion forms a moisture-resistant layer on the remaining polymer layer. The moisture-resistant layer of the disclosure is beneficial to block water or moisture from entering a redistribution layer and prevent the redistribution layer from delamination during the reliability test. Besides, no additional CVD film or photomask is required to form the moisture-resistant layer of the disclosure, so the process is cost-effective and competitive.

In accordance with some embodiments of the present disclosure, a method of forming a semiconductor package includes the following operations. A polymer layer is formed over a die. A metal feature is formed in the polymer layer. An argon-containing plasma treatment is performed to the polymer layer and the metal feature.

In accordance with alternative embodiments of the present disclosure, a method of forming a semiconductor package includes the following operations. At least one die is provided. A redistribution layer structure is formed over the at least one die. A bump structure is formed over the redistribution layer structure. A plasma treatment is performed to make an uppermost polymer layer of the redistribution layer structure more moisture-resistant.

In accordance with yet alternative embodiments of the present disclosure, a semiconductor package includes at least one die, a redistribution layer structure, a bump structure and a moisture-resistant layer. The redistribution layer structure is disposed over and electrically to the at least one die. The bump structure is disposed over and electrically connected to the redistribution layer structure. The moisture-resistant layer is disposed over the redistribution layer structure aside the bump structure and having a rough top surface.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor package, comprising:
   forming a polymer layer over a die;
   forming a metal feature in the polymer layer; and
   performing an argon-containing plasma treatment to the polymer layer and the metal feature, so as to form a treated hydrophobic portion on top of the polymer layer, wherein the treated hydrophobic portion contains argon.

2. The method of claim 1, wherein the argon plasma treatment further comprises He, Ne, Kr, Xe, $O_2$, $H_2$, $N_2$ or a combination thereof.

3. The method of claim 1, wherein the argon plasma treatment comprises an argon content of 30 vol % or more.

4. The method of claim 1, wherein the polymer layer comprises polybenzoxazole (PBO), polyimide (PI) or benzocyclobutene (BCB) or a combination thereof.

5. The method of claim 1, wherein the treated hydrophobic portion of the polymer layer has a wrinkled top surface from a top view.

6. The method of claim 5, wherein the treated hydrophobic portion of the polymer layer has a water contact angle of 70° to 120°.

7. The method of claim 1, wherein the metal feature comprises a redistribution layer, a bump structure or a combination thereof.

8. The method of claim 1, wherein treated hydrophobic portion of the polymer layer has a thickness of 20 angstroms or more.

9. A method of forming a semiconductor package, comprising:
   providing at least one die;
   forming a redistribution layer structure over the at least one die;
   forming a bump structure over the redistribution layer structure; and
   performing a plasma treatment to transform a portion of an uppermost polymer layer of the redistribution layer structure into a moisture-resistant layer containing argon.

10. The method of claim 9, wherein a gas of the plasma treatment comprises Ar.

11. The method of claim 10, wherein the gas of the plasma treatment further comprises He, Ne, Kr, Xe, $O_2$, $H_2$, $N_2$ or a combination thereof.

12. The method of claim 9, wherein forming a redistribution layer structure comprising:
    forming a first polymer layer;
    forming a first redistribution layer in the first polymer layer; and
    performing another plasma treatment to make the first polymer layer more moisture-resistant.

13. The method of claim 12, wherein a gas of the plasma treatment comprises Ar.

14. The method of claim 13, wherein the gas of the plasma treatment further comprises He, Ne, Kr, Xe, $O_2$, $H_2$, $N_2$ or a combination thereof.

15. A semiconductor package, comprising:
    at least one die;
    a redistribution layer structure, disposed over and electrically to the at least one die;
    a bump structure, disposed over and electrically connected to the redistribution layer structure; and
    a moisture-resistant layer, being an argon-containing layer and disposed over the redistribution layer structure aside the bump structure.

16. The semiconductor package of claim 15, wherein the moisture-resistant layer has a water contact angle of 70° to 120°.

17. The semiconductor package of claim 15, wherein the moisture-resistant layer has a surface roughness Rz of 0.1 µm or more.

18. The semiconductor package of claim 15, wherein the moisture-resistant layer has a thickness of 20 angstroms or more.

19. The semiconductor package of claim 15, wherein the moisture-resistant layer comprises a carbon atom content of 75 at % or more and an argon atom content of 0.2-2 at %.

20. The semiconductor package of claim 15, further comprising at least one moisture-resistant layer between polymer layers of the redistribution layer structure.

* * * * *